US011062739B2

(12) United States Patent
Fujiwara et al.

(10) Patent No.: US 11,062,739 B2
(45) Date of Patent: Jul. 13, 2021

(54) SEMICONDUCTOR CHIP HAVING MEMORY AND LOGIC CELLS

(71) Applicant: Taiwan Semiconductor Manufacturing Co., Ltd., Hsinchu (TW)

(72) Inventors: Hidehiro Fujiwara, Hsin-Chu (TW); Hsien-Yu Pan, Hsinchu (TW); Chih-Yu Lin, Taichung (TW); Yen-Huei Chen, Hsinchu County (TW); Wei-Chang Zhao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/454,076

(22) Filed: Jun. 27, 2019

(65) Prior Publication Data

US 2020/0411063 A1 Dec. 31, 2020

(51) Int. Cl.
*H01L 27/11* (2006.01)
*H01L 27/092* (2006.01)
*G11C 5/06* (2006.01)

(52) U.S. Cl.
CPC .......... *G11C 5/063* (2013.01); *H01L 27/1104* (2013.01); *H01L 27/092* (2013.01); *H01L 27/11* (2013.01)

(58) Field of Classification Search
CPC .... H01L 27/1104; H01L 27/092; H01L 27/11; H01L 2924/1437
See application file for complete search history.

(56) References Cited

U.S. PATENT DOCUMENTS

| | | | | |
|---|---|---|---|---|
| 5,563,820 A | * | 10/1996 | Wada | G11C 7/18 257/E27.098 |
| 5,978,301 A | * | 11/1999 | Maeno | H01L 27/11807 365/230.03 |
| 6,690,206 B2 | * | 2/2004 | Rikino | H01L 27/0203 257/E27.062 |
| 7,449,371 B2 | * | 11/2008 | Kemerling | H01L 27/11807 257/E27.108 |
| 9,324,715 B2 | * | 4/2016 | Azmat | H01L 27/0207 |
| 9,536,946 B2 | * | 1/2017 | Park | H01L 27/0207 |
| 9,640,444 B2 | * | 5/2017 | Do | H01L 21/823871 |

(Continued)

*Primary Examiner* — Ida M Soward
(74) *Attorney, Agent, or Firm* — JCIPRNET

(57) ABSTRACT

A semiconductor chip is provided. The semiconductor chip includes a memory cell and a logic cell disposed aside the memory cell, and includes signal and ground lines with the memory and logic cells located therebetween. The memory cell includes first and second active structures extending along a first direction, and includes a storage transmission gate line, first through third gate lines and a read transmission gate line extending along a second direction. The storage transmission gate line includes first and second line segments, which respectively extends across the active structures. The first through third gate lines continuously extend across the first and second active structures. The read transmission gate line includes third and fourth line segments, which respectively extend across the active structures. The first through third gate lines are located between the storage and read transmission gate lines.

12 Claims, 6 Drawing Sheets

(56) References Cited

U.S. PATENT DOCUMENTS

| | | | |
|---|---|---|---|
| 9,748,246 B2* | 8/2017 | Song | H01L 27/0207 |
| 10,366,997 B2* | 7/2019 | Yoon | H01L 27/1104 |
| 10,446,536 B2* | 10/2019 | Becker | H01L 27/0207 |
| 2006/0114030 A1* | 6/2006 | Yang | G11C 8/14 |
| | | | 326/101 |
| 2007/0272947 A1* | 11/2007 | Wu | H01L 27/0207 |
| | | | 257/202 |
| 2009/0189850 A1* | 7/2009 | Murayama | G09G 3/344 |
| | | | 345/107 |
| 2012/0119782 A1* | 5/2012 | Madurawe | H01L 27/11807 |
| | | | 326/47 |
| 2015/0370950 A1* | 12/2015 | Kawa | H01L 21/823871 |
| | | | 716/119 |
| 2016/0284704 A1* | 9/2016 | Moroz | H01L 27/0207 |
| 2019/0393205 A1* | 12/2019 | Lee | H01L 27/0207 |
| 2020/0328216 A1* | 10/2020 | Liaw | H01L 23/5226 |

* cited by examiner

SEMICONDUCTOR CHIP HAVING MEMORY AND LOGIC CELLS

BACKGROUND

Static random access memory (SRAM) has been widely used as a representative memory for logic integrated circuits. This is because SRAM array operates fast as logic circuits operate, and consumes a significantly low power at standby mode. In general, a layout topology of a SRAM cell is different from a layout topology of a standard logic cell. For instance, a cell height of a 10 T or 12 T SRAM cell (i.e., a SRAM cell having 10 or 12 metal-oxide-semiconductor field effect transistors (MOSFETs)) may be much greater than a cell height of the standard logic cell. As such, the SRAM cells and the standard logic cells are often disposed in different regions, and spaced apart from each other. A dummy SRAM cell and an isolation structure are usually disposed between the adjacent SRAM cell and standard logic cell. As a result, an area utilization efficiency of a semiconductor chip containing the SRAM cell and the standard logic cell is limited.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
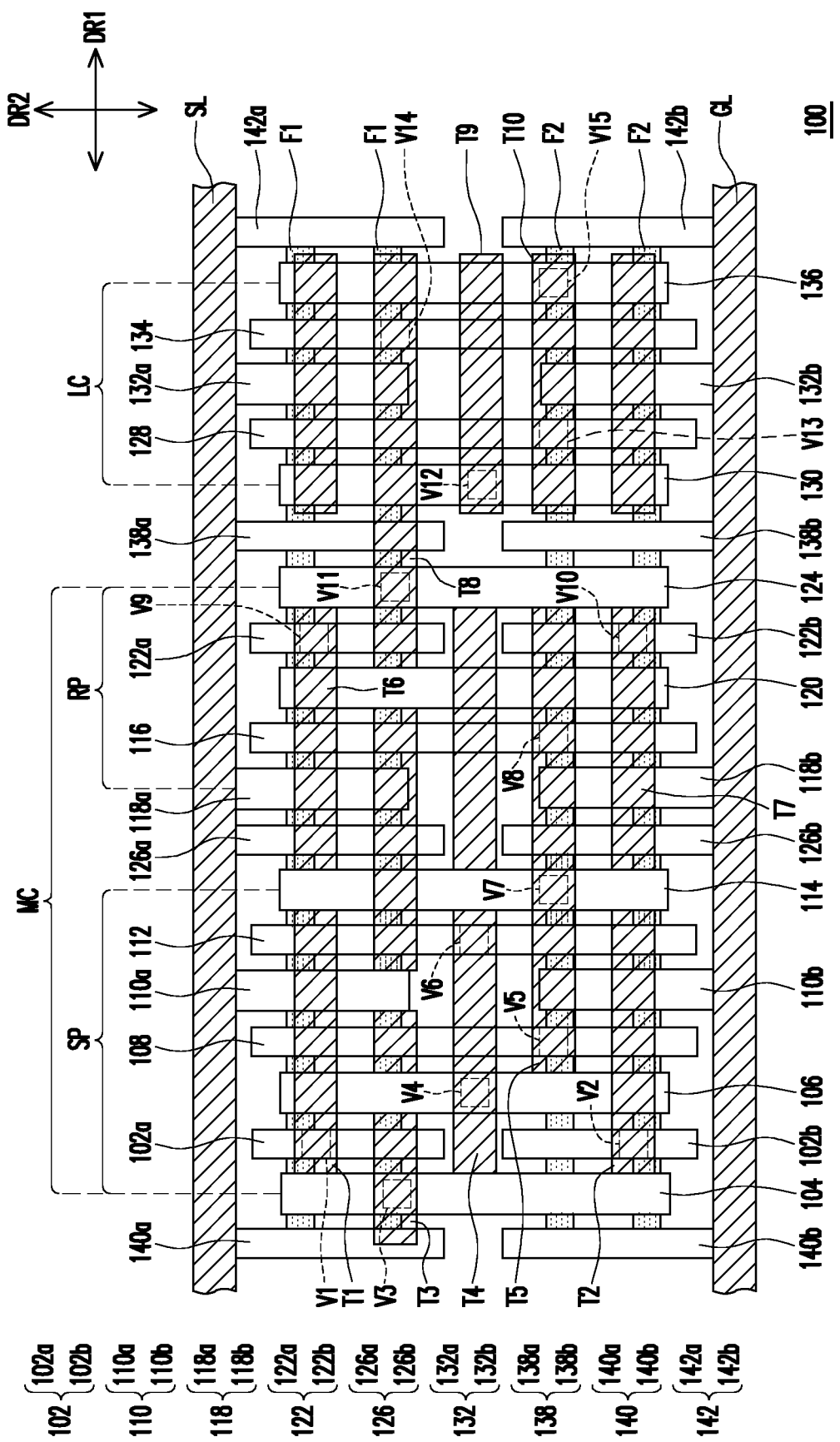
FIG. 1A is a schematic layout diagram of a semiconductor chip according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

Embodiments will be described with respect to a specific context, namely a semiconductor chip containing a memory cell, such as a static random access memory (SRAM) cell, and a standard logic cell. However, to other circuits and layouts is desired. Throughout the various views and illustrative embodiments, like reference numbers are used to designate like elements.

Figure 1B:
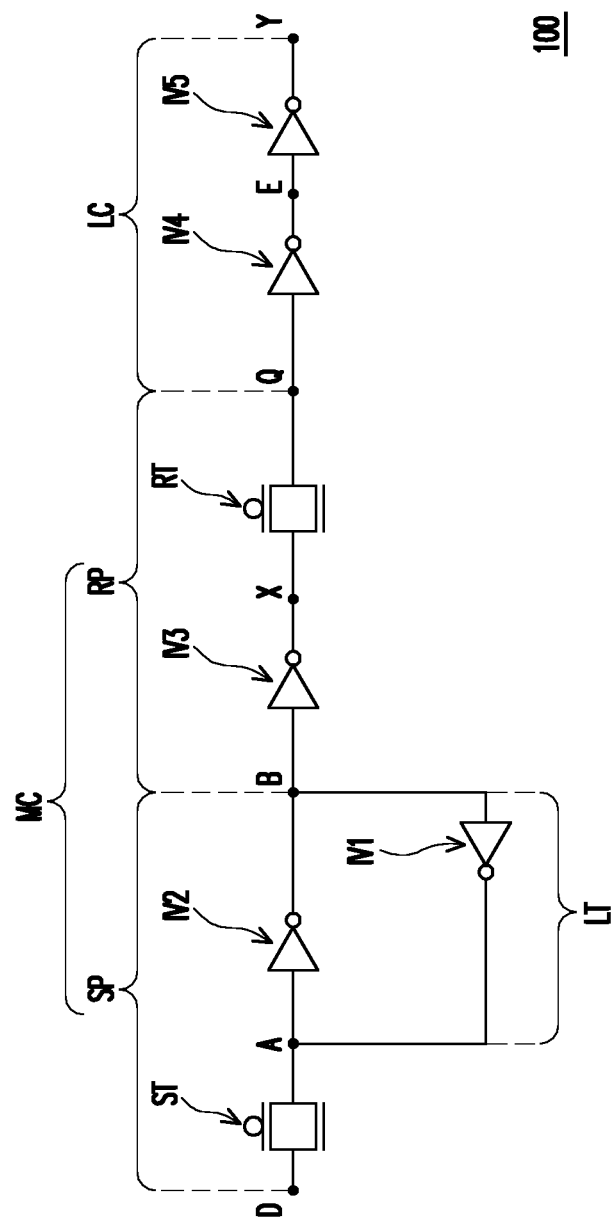
FIG. 1B is an equivalent circuit diagram of the semiconductor chip shown in FIG. 1A.

FIG. 1A is a schematic layout diagram of a semiconductor chip 100 according to some embodiments of the present disclosure. FIG. 1B is an equivalent circuit diagram of the semiconductor chip 100 shown in FIG. 1A.

Figure 3A:
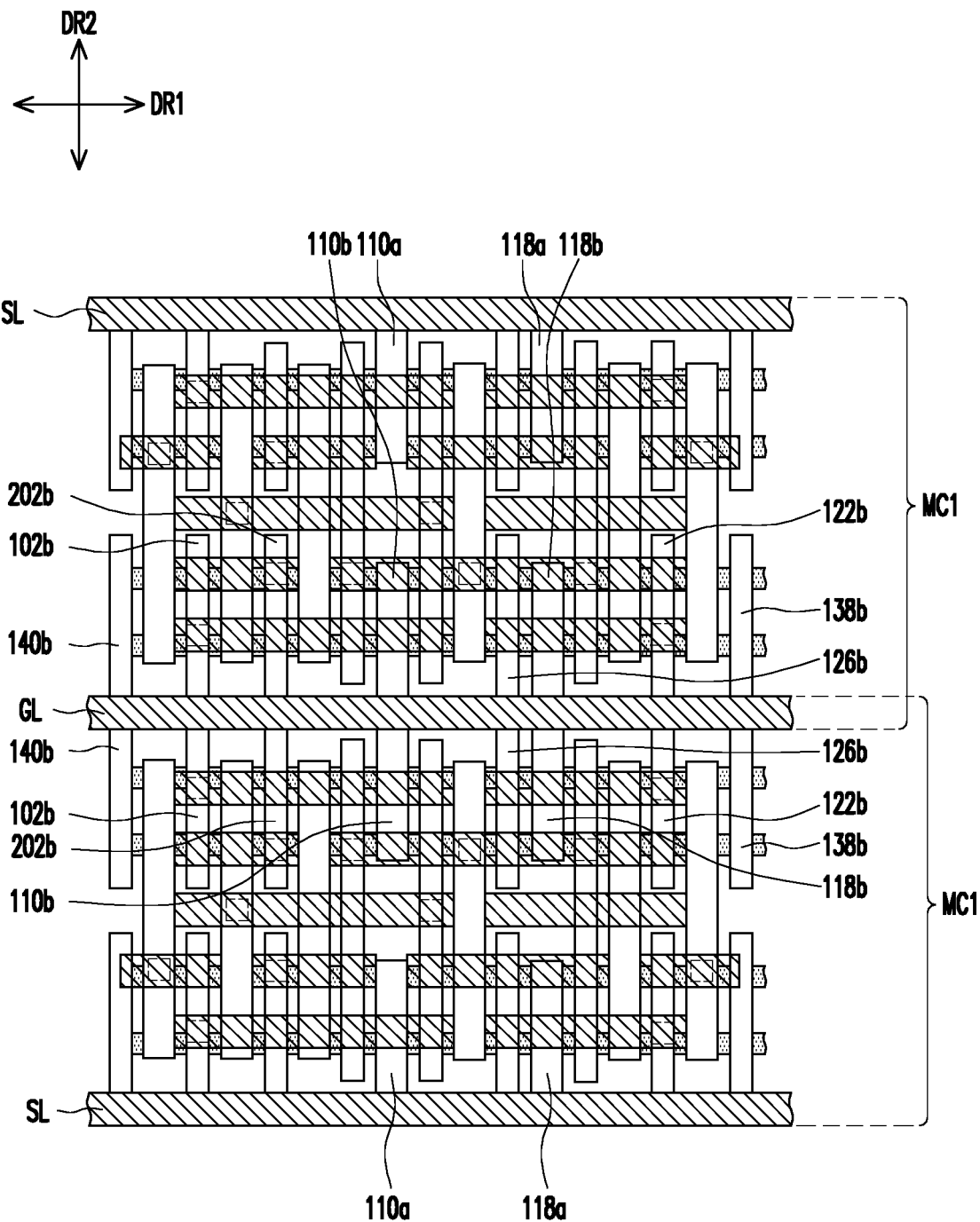
FIG. 3A is a schematic layout diagram of two memory cells according to some embodiments of the present disclosure.
Figure 3B:
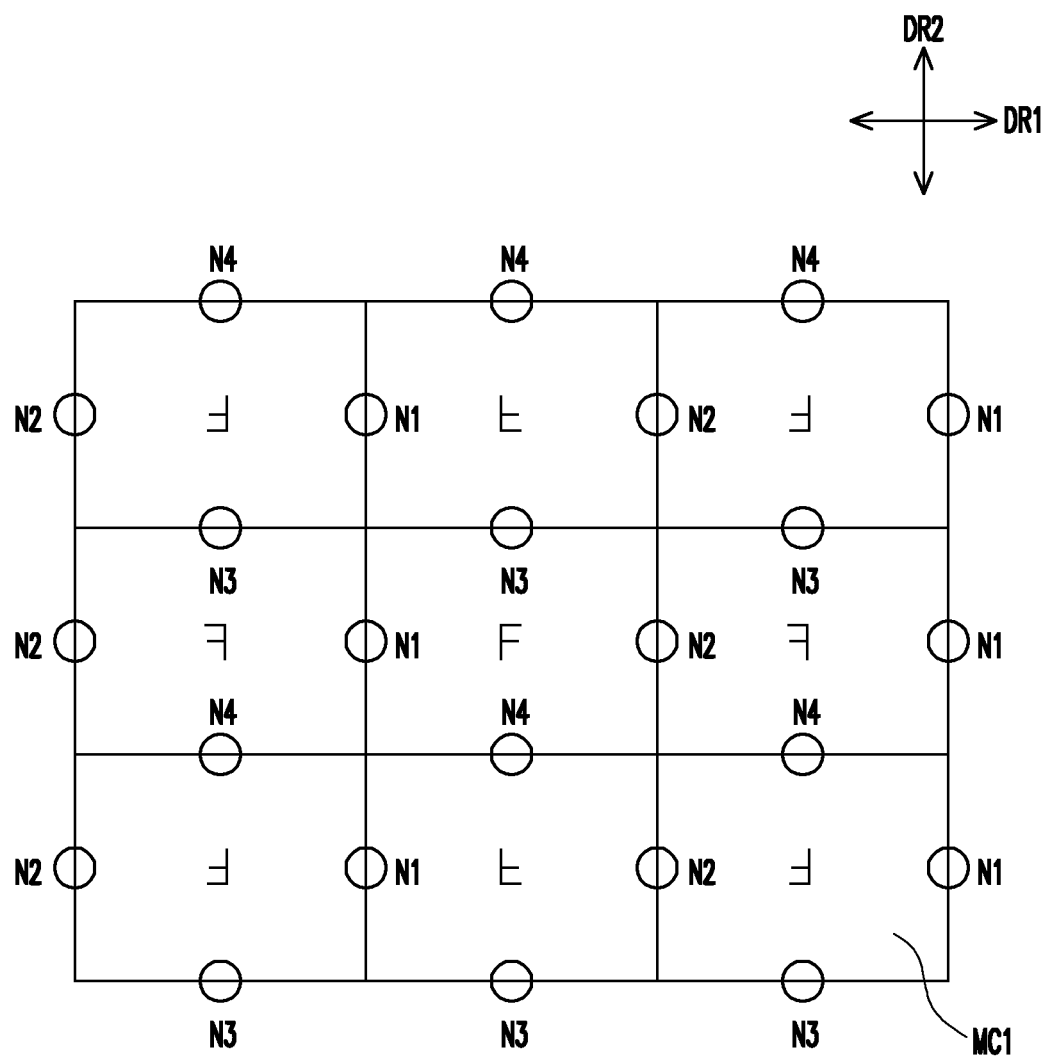
FIG. 3B schematically illustrates symmetry of a plurality of memory cells according to some embodiments of the present disclosure.

Referring to FIG. 1A, in some embodiments, the semiconductor chip 100 includes a memory cell MC. In certain embodiments, the memory cell MC is a SRAM cell. For instance, the memory cell MC may be a 10 T (transistor) SRAM cell, which is referred as a SRAM cell containing 10 MOSFETs. Although only one memory cell MC is illustrated in FIG. 1A, it is noted that a plurality of the memory cells MC may actually be disposed in the semiconductor chip 100 (as shown in FIG. 3A and FIG. 3B). Those skilled in the art may adjust the amount and arrangement of the memory cells MC based on actual design requirements, the present disclosure is not limited thereto.

An equivalent circuit of the memory cell MC will now be described with reference to FIG. 1B. Referring to FIG. 1B, the memory cell MC has a storage part SP and a read part RP. The storage part SP may be defined between a storage terminal D and a node B of the circuit of the memory cell MC, whereas the read part RP may be defined between the node B and a read terminal Q of the equivalent circuit of the memory cell MC. In some embodiments, the storage part SP includes a storage transmission gate ST and a latch circuit LT serially connected with the storage transmission gate ST. The storage transmission gate ST is electrically connected between the storage terminal D and a node A, whereas the latch circuit LT is electrically connected between the node A and the node B. In some embodiments, the latch circuit LT includes a first inverter IV1 and a second inverter IV2. The first inverter IV1 and the second inverter IV2 are connected back to back. In other words, an output of one of the first and second inverters IV1 and IV2 is electrically connected to an input of the other, and vice-versa. For instance, the input of the first inverter IV1 and the output of the second inverter IV2 are electrically connected to the node B, whereas the output of the first inverter IV1 and the input of the second inverter IV2 are electrically connected to the node A. As such, the node A is electrically connected to the storage transmission gate ST, the first inverter IV1 and the second inverter IV2.

Regarding the read part RP, the read part RP includes a read transmission gate RT and a third inverter IV3. In some embodiments, the latch circuit LT and the third inverter IV3 are serially connected between the storage transmission gate ST and the read transmission gate RT, and the third inverter IV3 is serially connected between the latch circuit LT and the read transmission gate RT. In these embodiments, the third inverter IV3 is electrically connected between the node B and a node X, whereas the read transmission gate RT is electrically connected between the node X and the read terminal Q. As such, the node B is electrically connected to the first inverter IV1, the second inverter IV2 and the third inverter IV3, and the node X is electrically connected between the third inverter IV3 and the read transmission gate RT.

It should be noted that, each circuit element "transmission gate" mentioned in the present disclosure may include a complementary metal-oxide-semiconductor (CMOS) circuit having an N type MOSFET (e.g., a fin-type field effect transistor (finFET) of N type) and a P type MOSFET (e.g., a finFET of P type), of which the drain terminals are electrically connected together as an input/output, whereas the source terminals are electrically connected together as another input/output. In addition, each circuit element "inverter" mentioned in the present disclosure may include a CMOS circuit having an N type MOSFET and a P type MOSFET, of which the gate terminals are electrically connected together as an input/output, whereas the drain terminals (or source terminals) are electrically connected together as another input/output.

Furthermore, a layout of the semiconductor chip 100 having an equivalent circuit shown in FIG. 1B will now be described with reference to FIG. 1A. Referring to FIG. 1A, the semiconductor chip 100 includes first active structures F1 and second active structures F2. A portion of the first and second active structures F1 and F2 are included in the memory cell MC. The first and second active structures F1 and F2 extend along a first direction DR1, and are spaced apart from each other. Although only two first active structures F1 and two second active structures F2 are illustrated in FIG. 1A, those skilled in the art can adjust the amount of the first and second active structures F1 and F2 based on design requirements, the present disclosure is not limited thereto. The first and second active structures F1 and F2 may be semiconductor fins, and may function as active areas of the MOSFETs formed thereon. The first active structures F1 have a first conductive type, whereas the second active structures F2 have a second conductive complementary to the first conductive type. For instance, in some embodiments, the first conductive type is N type, whereas the second conductive type is P type.

The storage part SP of the memory cell MC includes a storage transmission gate line 102, a first source/drain line 104 and a second source/drain line 106. The storage transmission gate line 102 and the first and second source/drain lines 104 and 106 are functioned as terminals of the storage transmission gate ST as shown in FIG. 1B. The storage transmission gate line 102, the first source/drain line 104 and the second source/drain line 106 extend along a second direction DR2 intersected with the first direction DR1, and the storage transmission gate line 102 is located between the first and second source/drain lines 104 and 106. In some embodiments, the second direction DR2 is substantially perpendicular to the first direction DR1. The first and second source/drain lines 104 and 106 continuously extend to intersect the first and second active structures F1 and F2 from above the first and second active structures F1 and F2.

In addition, the storage transmission gate line 102 includes first and second gate line segments 102a and 102b, which extend along the second direction DR2, and are separated from each other. The first gate line segment 102a intersects with the first active structures F1 from above the first active structures F1, whereas the second gate line segment 102b intersects with the second active structures F2 from above the second active structures F2. The storage transmission gate line 102, the first and second source/drain lines 104 and 106 at opposite sides of the storage transmission gate line 102 and the underlying portions of the first and second active structures F1 and F2 define MOSFETs of complementary conductive types, of which source terminals and drain terminals are electrically connected together, respectively. As such, these MOSFETs of complementary conductive types constitute the storage transmission gate ST as shown in FIG. 1B. In some embodiments, the first source/drain line 104 is functioned as an input of the storage transmission gate ST, as indicated by the storage terminal D shown in FIG. 1B. In addition, the second source/drain line 106 is functioned as an output of the storage transmission gate ST, as indicated by the node A shown in FIG. 1B. In some embodiments, the first gate line segment 102a may be out routed through a via V1 and a trace T1, and the second gate line segment 102b may be out routed through a via V2 and a trace T2. In addition, the first source/drain line 104 may be out routed through a via V3 and a trace T3, and the second source/drain line 106 may be out routed through a via V4 and a trace T4.

The storage part SP of the memory cell MC further includes a first gate line 108 and a third source/drain line 110. The first gate line 108, the second source/drain lines 106 and the third source/drain line 110 are functioned as terminals of the first inverter IV1 as shown in FIG. 1B. The first gate line 108 and the third source/drain lines 110 extend along the second direction DR2, and the first gate line 108 is located between the second and third source/drain lines 106 and 110. The first gate line 108 continuously extends to intersect the first and second active structures F1 and F2 from above the first and second active structures F1 and F2. The third source/drain line 110 includes first and second source/drain line segments 110a and 110b. The first and second source/drain line segments 110a and 110b both extend along the second direction DR2, and are separated from each other. The first source/drain line segment 110a intersects with the first active structures F1 from above the first active structures F1, whereas the second source/drain line segment 110b intersects with the second active structures F2 from above the second active structures F2. The first gate line 108, the second and third source/drain lines 106 and 110 at opposite sides of the first gate line 108 and the underlying portions of the first and second active structures F1 and F2 define MOSFETs of complementary conductive types, of which gate terminals and drain terminals (or source terminals) are connected together. As such, these MOSFETs of complementary conductive types constitute the first inverter IV1 as shown in FIG. 1B. In some embodiments, the first gate line 108 is functioned as an input of the first inverter IV1, and is indicated by the node B as shown in FIG. 1A. In addition, the second source/drain line 106 may be an output of the first inverter IV1. In these embodiments, the outputs of the storage transmission gate ST and the first inverter IV1 are connected together, and is indicated by the node A as shown in FIG. 1A. In some embodiments, the first gate line 108 may be out routed through a via V5 and a trace T5. In addition, the first and second source/drain line segments 110*a* and 110*b* are respectively and electrically connected with a signal line SL and a ground line GL by, for example, vias (not shown).

The storage part SP of the memory cell MC further includes a second gate line 112 and a fourth source/drain line 114. The second gate line 112, the third source/drain lines 110 and the fourth source/drain line 114 are functioned as terminals of the second inverter IV2 as shown in FIG. 1B. The second gate line 112 and the fourth source/drain lines 114 extend along the second direction DR2, and the second gate line 112 is located between the third and fourth source/drain lines 110 and 114. The second gate line 112 and the fourth source/drain line 114 continuously extend to intersect the first and second active structures F1 and F2 from above the first and second active structures F1 and F2. The second gate line 112, the third and fourth source/drain line 110 and 114 at opposite sides of the second gate line 112 and the underlying portions of the first and second active structures F1 and F2 define MOSFETs of complementary conductive types, of which gate terminals and drain terminals (or source terminals) are connected together. As such, these MOSFETs of complementary conductive types constitute the second inverter IV2 as shown in FIG. 1B. In some embodiments, the second gate line 112 is functioned as an input of the second inverter IV2. In addition, the second gate line 112, the outputs of the storage transmission gate ST and the first inverter IV1 (i.e., the second source/drain line 106) are electrically connected together, and is indicated as the node A shown in FIG. 1B. In these embodiments, the fourth source/drain line 114 is functioned as an output of the second inverter IV2. Furthermore, the output of the second inverter IV2 (i.e., the fourth source/drain line 114) and the input of the first inverter IV1 (i.e., the first gate line 108) are connected together, and is indicated as the node B shown in FIG. 1B. In some embodiments, the second gate line 112 is out routed through a via V6 and the trace T4 shared with the second source/drain line 106. In addition, the fourth source/drain line 114 is out routed through a via V7 and the trace T5 shared with the first gate line 108.

So far, a layout of the storage part SP of the memory cell MC according to some embodiments has been described. The other part of the memory cell MC (i.e., the read part RP) will now be described with reference to FIG. 1A and FIG. 1B.

The read part RP of the memory cell MC includes a third gate line 116, a fifth source/drain line 118 and a sixth source/drain line 120. The third gate line 116, the fifth source/drain lines 118 and the sixth source/drain line 120 are functioned as terminals of the third inverter IV3 as shown in FIG. 1B. The third gate line 116, the fifth source/drain line 118 and the sixth source/drain lines 120 extend along the second direction DR2, and the third gate line 116 is located between the fifth and sixth source/drain lines 118 and 120. The third gate line 116 and the sixth source/drain line 120 continuously extend to intersect with the first and second active structures F1 and F2 from above the first and second active structures F1 and F2. The fifth source/drain line 118 includes third and fourth source/drain line segments 118*a* and 118*b*. The third and fourth source/drain line segments 118*a* and 118*b* both extend along the second direction DR2, and are separated from each other. The third source/drain line segment 118*a* intersects with the first active structures F1 from above the first active structures F1, whereas the fourth source/drain line segment 118*b* intersects with the second active structures F2 from above the second active structures F2. The third gate line 116, the fifth and sixth source/drain line 118 and 120 at opposite sides of the third gate line 116 and the underlying portions of the first and second active structures F1 and F2 define MOSFETs of complementary conductive types, of which gate terminals and drain terminals (or source terminals) are connected together. As such, these MOSFETs of complementary conductive types constitute the third inverter IV3 as shown in FIG. 1B. In some embodiments, the third gate line 116 is functioned as an input of the third inverter IV3. In addition, the third gate line 116, the input of the first inverter IV1 (i.e., the first gate line 108) and the output of the second inverter IV2 (i.e. the fourth source/drain line 114) are electrically connected together, and is indicated by the node B as shown in FIG. 1B. On the other hand, the sixth source/drain line 120 is functioned as an output of the third inverter IV3, and is indicated as the node X shown in FIG. 1B. In some embodiments, the third gate line 116 is out routed through a via V8 and the trace T5 shared with the first gate line 108 and the fourth source/drain line 114. In addition, the third and fourth source/drain line segments 118*a* and 118*b* are respectively and electrically connected with the signal line SL and the ground line GL by, for example, vias (not shown).

The read part RP of the memory cell MC further includes a read transmission gate line 122 and a seventh source/drain line 124. The read transmission gate line 122, the sixth source/drain line 120 and the seventh source/drain lines 124 are functioned as terminals of the read transmission gate RT as shown in FIG. 1B. The read transmission gate line 122 and the seventh source/drain line 124 extend along the second direction DR2, and the read transmission gate line 122 is located between the sixth and seventh source/drain lines 120 and 124. The seventh source/drain line 124 continuously extend to intersect with the first and second active structures F1 and F2 from above the first and second active structures F1 and F2. The read transmission gate line 122 includes third and fourth gate line segments 122*a* and 122*b*. The third and fourth gate line segments 122*a* and 122*b* extend along the second direction DR2, and are separated from each other. The third gate line segment 122*a* intersects with the first active structures F1 from above the first active structures F1, whereas the fourth gate line segment 122*b* intersects with the second active structures F2 from above the second active structures F2. The read transmission gate line 122, the sixth and seventh source/drain lines 120 and 124, and the underlying portions of the first and second active structures F1 and F2 define MOSFETs of complementary conductive types, of which source terminals and drain terminals are respectively connected together. As such, these MOSFETs of complementary conductive types constitute the read transmission gate RT as shown in FIG. 1B. In some embodiments, the sixth source/drain line 120, which is the output of the third inverter IV3, is also an input of the read transmission gate RT, and is indicated by the node X as shown in FIG. 1B. In addition, the seventh source/drain line 124 is functioned as an output of the read transmission gate RT, and is indicated as the read terminal Q in FIG. 1B. In some embodiments, the third gate line segment 122*a* is out routed through a via V9 and a trace T6, and the fourth gate line segment 122*b* is out routed through a via V10 and a trace T7. In addition, the seventh source/drain line 124 is out routed through a via V11 and a trace T8.

Up to here, the storage part SP and read part RP of the memory cell MC according to some embodiments have been described. As shown in FIG. 1A, the first and second active structures F1 and F2 penetrate through the storage part SP and the read part RP along the first direction DR1. The storage transmission gate line 102, the first through third gate lines 108, 112 and 116 and the read transmission gate line 122 extend along the second direction DR2. In addition, the first through third gate lines 108, 112 and 116 are sequentially arranged away from the storage transmission gate line 102, and located between the storage transmission gate line 102 and the read transmission gate line 122. In some embodiments, the signal line SL and the ground line GL extend along the first direction DR1 at opposite sides of the storage part SP and the read part RP of the memory cell MC. As such, boundaries of the storage part SP along the first direction DR1 may be defined by the signal line SL and the ground line GL, whereas boundaries of the storage part SP along the second direction DR2 may be defined by the first and fourth source/drain lines 104 and 114. In addition, boundaries of the read part SP along the first direction DR1 may be defined by the signal line SL and the ground line GL, whereas boundaries of the read part RP along the second direction DR2 may be defined by the fifth and seventh source/drain lines 118 and 124.

In some embodiments, the memory cell MC further includes a dummy gate line 126. The dummy gate line 126 extends along the second direction DR2, and is located between storage part SP and the read part RP. In some embodiments, the dummy gate line 126 is disposed between the fourth and fifth source/drain lines 114 and 118. The dummy gate line 126 includes first and second dummy gate line segments 126a and 126b. The first and second dummy gate line segments 126a and 126b extend along the second direction DR2, and are separated from each other. The first dummy gate line segment 126a intersects with the first active structures F1 from above the first active structures F1, and are electrically connected with the signal line SL by, for example, a via (not shown). The second dummy gate line segment 126b intersects with the second active structures F2 from above the second active structures F2, and are electrically connected with the ground line GL by, for example, a via (not shown). The first dummy gate line segment 126a, portions of the fourth and fifth source/drain lines 114 and 118 at opposite sides of the first dummy gate line segment 126a and the underlying portions of the first active structures F1 define dummy MOSFETs of the second conductive type. For instance, a conductive type of these dummy MOSFETs is P type, and the first dummy gate line segment 126a receives a positive voltage through the signal line SL. As such, these dummy MOSFETs are kept off, so as to function as an isolation device between devices formed at opposite sides of these dummy MOSFETs. In addition, the second dummy gate line segment 126b, portions of the fourth and fifth source/drain lines 114 and 118 at opposite sides of the second dummy gate line segment 126b and the underlying portions of the second active structures F2 define dummy MOSFETs of the first conductive type. For instance, a conductive type of these dummy MOSFETs is N type, and the second dummy gate line segment 126b receives a ground voltage through the ground line GL. As such, these dummy MOSFETs are also kept off, so as to function as an isolation device between devices formed at opposite sides of these dummy MOSFETs. In some embodiments, transistors in the storage part SP and transistors in the read part RP are operated at different threshold voltages, and can be isolated from each other by disposing the dummy gate line 126 between the storage part SP and the read part RP.

In addition to the memory cell MC, the semiconductor chip 100 further includes a logic cell LC. The logic cell LC is disposed aside the memory cell MC. In some embodiments, the logic cell LC is physically connected with the memory cell MC by the first and second active structures F1 and F2. In these embodiments, the first and second active structures F1 and F2 may penetrate through the memory cell MC and the logic cell LC. In addition, the memory cell MC and the logic cell LC may be located and electrically connected between the signal line SL and the ground line GL.

An equivalent circuit of the logic cell LC will now be described with reference to FIG. 1B. Referring to FIG. 1B, in some embodiments, the logic cell LC includes a fourth inverter IV4 and a fifth inverter IV5. The fourth inverter IV4 and the fifth inverter IV5 are connected in series. An output of the fourth inverter IV4 is connected to an input of the fifth inverter IV5, and is indicated as a node E. An input of the fourth inverter IV4 is connected to the output of the memory cell MC (i.e., the read terminal Q), and an output of the fifth inverter IV5 is indicated as a terminal Y. However, those skilled in the art may modify the circuit in the logic cell LC according to design requirements, the present disclosure is not limited thereto.

Further, a layout of the logic cell LC having the equivalent circuit shown in FIG. 1B will now be described with reference to FIG. 1A. Referring to FIG. 1A, the logic cell LC includes a fourth gate line 128, an eighth source/drain line 130 and a ninth source/drain line 132. The fourth gate line 128, the eighth source/drain lines 130 and the ninth source/drain line 132 are functioned as terminals of the fifth inverter IV5 as shown in FIG. 1B. The fourth gate line 128, the eighth source/drain line 130 and the ninth source/drain line 132 extend along the second direction DR2, and the fourth gate line 128 is located between the eighth and ninth source/drain lines 130 and 132. The fourth gate line 128 and the eighth source/drain line 130 continuously extend to intersect with the first and second active structures F1 and F2 from above the first and second active structures F1 and F2. The ninth source/drain line 132 includes fifth and sixth source/drain line segments 132a and 132b. The fifth and sixth source/drain line segments 132a and 132b both extend along the second direction DR2, and are separated from each other. The fifth source/drain line segment 132a intersects with the first active structures F1 from above the first active structures F1, whereas the sixth source/drain line segment 132b intersects with the second active structures F2 from above the second active structures F2. The fourth gate line 128, the eighth and ninth source/drain line 130 and 132 at opposite sides of the fourth gate line 128 and the underlying portions of the first and second active structures F1 and F2 define MOSFETs of complementary conductive types, of which gate terminals and drain terminals (or source terminals) are connected together. As such, these MOSFETs of complementary conductive types constitute the fifth inverter IV5 as shown in FIG. 1B. The fourth gate line 128 is functioned as an input of the fifth inverter IV5, and connected to the node E as shown in FIG. 1B. In some embodiments, the fourth gate line 128 is out routed through a via V13 and a trace T10. In addition, the eighth source/drain line 130 is functioned as an output of the fifth inverter IV5, and is connected to the terminal Y as shown in FIG. 1B. In some embodiment, the eight source/drain line 130 is out routed through a via V12 and a trace T9. Furthermore, the fifth and sixth source/drain line segments 132a and 132b of the ninth source/drain line 132 are respectively and electrically connected with the signal line SL and the ground line GL by, for example, vias (not shown).

The logic cell LC further includes a fifth gate line 134 and a tenth source/drain line 136. The fifth gate line 134, the ninth source/drain line 132 and the tenth source/drain line 136 are functioned as terminals of the fourth inverter IV4 as shown in FIG. 1A. The fifth gate line 134, the ninth source/drain line 132 and the tenth source/drain line 136 extend along the second direction DR2, and the fifth gate line 132 is located between the ninth and tenth source/drain lines 132 and 136. The fifth gate line 132 and the tenth source/drain line 136 continuously extend to intersect with the first and second active structures F1 and F2 from above the first and second active structures F1 and F2. The fifth gate line 132, the ninth and tenth source/drain line 132 and 136 at opposite sides of the fifth gate line 132 and the underlying portions of the first and second active structures F1 and F2 define MOSFETs of complementary conductive types, of which gate terminals and drain terminals (or source terminals) are connected together. As such, these MOSFETs of complementary conductive types constitute the fourth inverter IV4 as shown in FIG. 1B. In some embodiments, the fifth gate line 132 is functioned as an input of the fourth inverter IV4, and connected to the read terminal Q of the memory cell MC as shown in FIG. 1B. The tenth source/drain line 136 may be functioned as an output of the fourth inverter IV4, and is connected to the node E connecting to the input of the fifth inverter IV5 as shown in FIG. 1B. In some embodiments, the fifth gate line 134 is out routed through a via V14 and the trace T8 shared with the read transmission gate line 122 of the memory cell MC. In addition, the tenth source/drain line 136 is out routed through a via V15 and the trace T10 shared with the fourth gate line 128.

Up to here, the layout of the logic cell LC has been described. As shown in FIG. 1B, boundaries of the logic cell LC along the first direction DR1 may be defined by the signal line SL and the ground line GL. On the other hand, boundaries of the logic cell LC along the second direction DR2 may be defined by the eighth and tenth source/drain lines 130 and 136. Regarding the whole layout of the semiconductor chip 100, the memory cell MC and the logic cell LC are both located between the same pair of signal line SL and the ground line GL, and both are penetrated by the same active structures (i.e., the first and second active structures F1 and F2). In other words, a cell height of the memory cell MC along the second direction DR2 may be substantially equal to a cell height of the logic cell LC along the second direction DR2. As such, a layout topology of the memory cell MC is rather similar to a layout topology of the logic cell LC, except that a cell width of the memory cell MC along the first direction DR1 may be greater than a cell width of the logic cell LC along the first direction DR1. Accordingly, the memory cell MC and the logic cell LC can be physically connected together, and an isolation structure (e.g., a shallow trench isolation (STI) structure) and/or a dummy memory cell are no longer required to be disposed between the memory cell MC and the logic cell LC. Therefore, an area utilization efficiency of the semiconductor chip 100 is improved.

In some embodiments, the semiconductor chip 100 further includes a dummy gate line 138. The dummy gate line 138 extends along the second direction DR2, and is disposed between the memory cell MC and the logic cell LC. In some embodiments, the dummy gate line 138 is disposed between the seventh and eighth source/drain lines 124 and 130. The dummy gate line 138 may include dummy gate line segments 138a and 138b, which extend along the second direction DR2, and are separated from each other. The dummy gate line segment 138a intersects with the first active structures F1 from above the first active structures F1, and may be electrically connected with the signal line SL by, for example, a via (not shown). The dummy gate line segment 138b intersects with the second active structures F2 from above the second active structures F2, and may be electrically connected with the ground line GL by, for example, a via (not shown). The dummy gate line segment 138a, portions of the seventh and eighth source/drain lines 124 and 130 at opposite sides of the dummy gate line segment 138a and the underlying portions of the first active structures F1 define dummy MOSFETs of the second conductive type. For instance, a conductive type of these dummy MOSFETs is P type, and the dummy gate line segment 138a receives a positive voltage through the signal line SL. As such, these dummy MOSFETs are kept off, so as to function as an isolation device between devices formed at opposite sides of these dummy MOSFETs. On the other hand, the dummy gate line segment 138b, portions of the seventh and eighth source/drain lines 124 and 130 at opposite sides of the dummy gate line segment 138b and the underlying portions of the second active structures F2 define dummy MOSFETs of the first conductive type. For instance, a conductive type of these dummy MOSFETs is N type, and the dummy gate line segment 138b receives a ground voltage through the ground line GL. As such, these dummy MOSFETs are kept off, so as to function as an isolation device between devices formed at opposite sides of these dummy MOSFETs. Accordingly, devices in the memory cell MC and devices in the logic cell LC can be isolated from each other by disposing the dummy gate line 138 between the memory cell MC and the logic cell LC.

Similar to the dummy gate line 138, the semiconductor chip 100 may further include dummy gate lines 140 and 142. The dummy gate line 140 may extend along the second direction DR2, and is disposed at an interface between the memory cell MC and another memory cell (not shown). The dummy gate line 140 has dummy gate line segments 140a and 140b, which respectively intersects with the first and second active structures F1 and F2. In addition, the dummy gate line segments 140a and 140b may be respectively and electrically connected with the signal line SL and the ground line GL by, for example, vias (not shown). By disposing the dummy gate line 140, devices in the memory cell MC can be isolated from devices in the adjacent memory cell (not shown). In addition, the dummy gate line 142 may extend along the second direction DR2, and is disposed at an interface between the logic cell LC and another logic cell (not shown). The dummy gate line 142 has dummy gate line segments 142a and 142b, which respectively intersects with the first and second active structures F1 and F2. In addition, the dummy gate line segments 142a and 142b may be respectively and electrically connected with the signal line SL and the ground line GL by, for example, vias (not shown). By disposing the dummy gate line 142, devices in the logic cell LC can be isolated from devices in the adjacent logic cell (not shown).

Figure 2A:
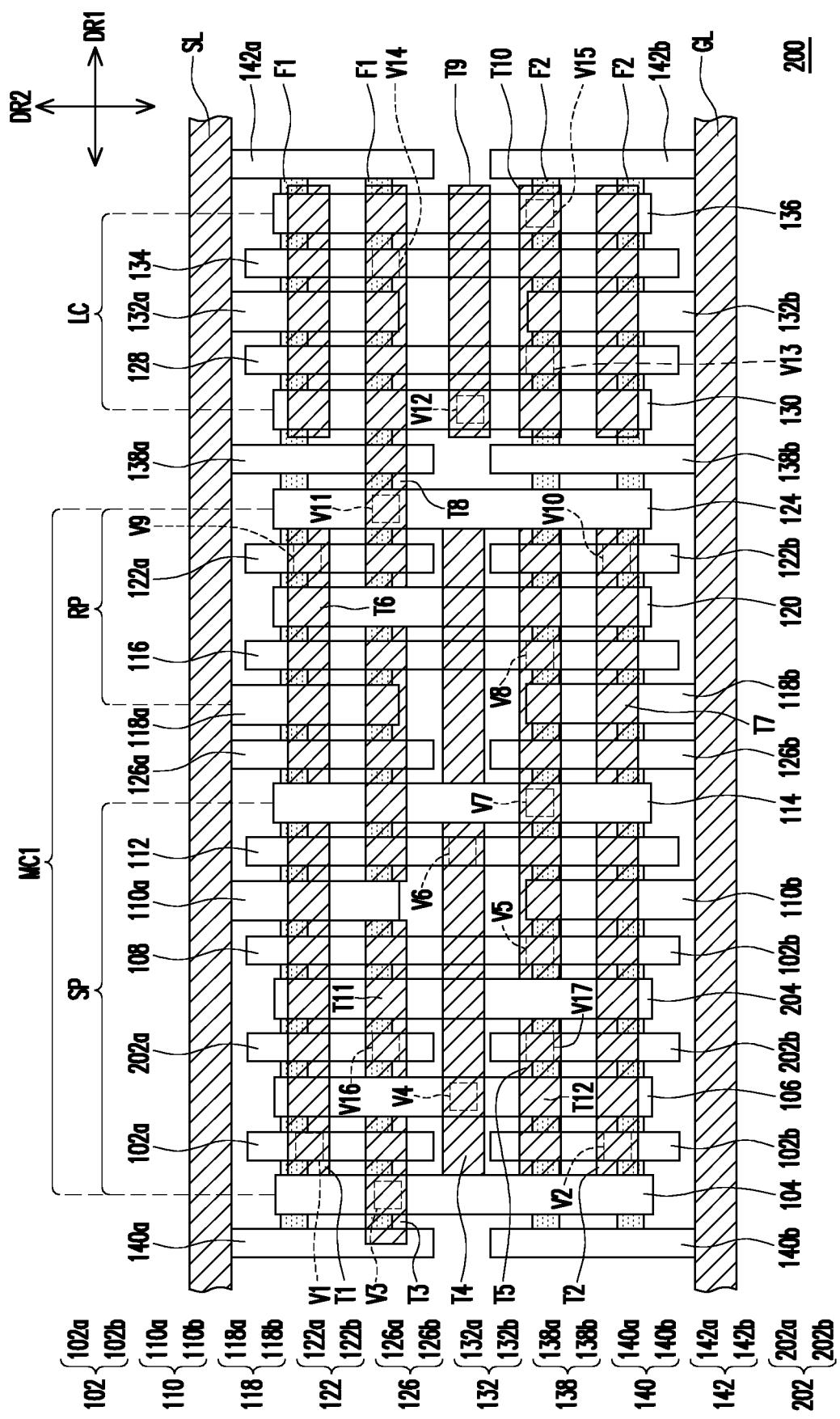
FIG. 2A is a schematic layout diagram of a semiconductor chip according to some embodiments of the present disclosure.
Figure 2B:
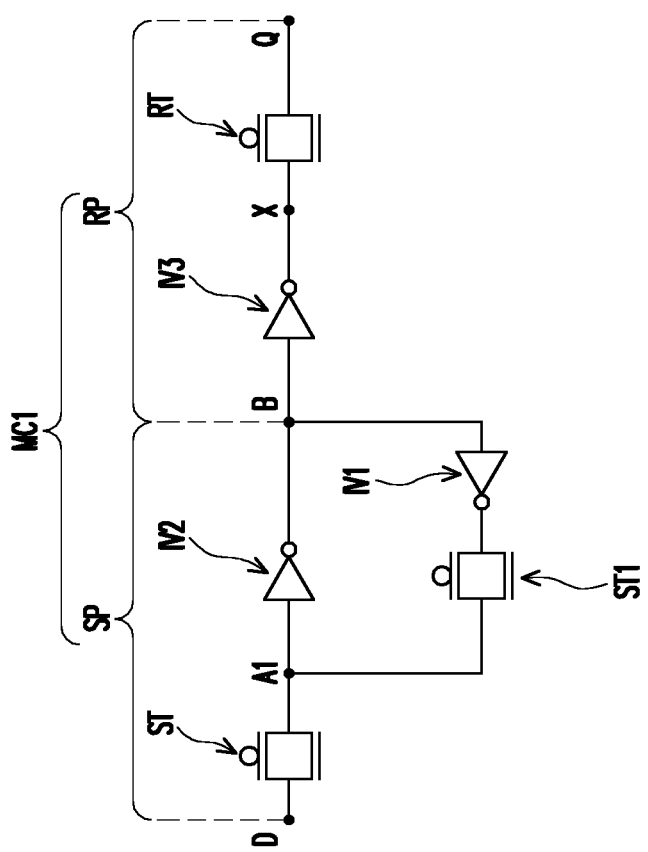
FIG. 2B is an equivalent circuit diagram of the semiconductor chip shown in FIG. 2A.

FIG. 2A is a schematic layout diagram of a semiconductor chip 200 according to some embodiments of the present disclosure. FIG. 2B is an equivalent circuit diagram of the semiconductor chip 200 shown in FIG. 2A. The semiconductor chip 200 is similar to the semiconductor chip 100 as illustrated in FIG. 1A and FIG. 1B. The differences between the semiconductor chip 200 and the semiconductor chip 100 will be further described, while the description of the same or similar components will not be repeated herein.

Referring to FIG. 2B, the memory cell MC1 of the semiconductor chip 200 may be a 12 T (transistor) SRAM cell, which is referred as a SRAM cell containing 12 MOSFET transistors. As compared to the memory cell MC shown in FIG. 1A and FIG. 1B, the memory cell MC1 of the semiconductor chip 200 further includes an additional transmission gate ST1. The additional transmission gate ST1 is disposed within the storage part SP. In some embodiments, the additional transmission gate ST1 is electrically connected between a node A1 and the output of the first inverter IV1. The node A1 is electrically connected with the output of the storage transmission gate ST, the input of the second inverter IV2 and the output of the additional transmission gate ST1.

Referring to FIG. 2A, a layout of the semiconductor chip 200 having the equivalent circuit as shown in FIG. 2B will now be described. The memory cell MC1 of the semiconductor chip 200 further includes an additional transmission gate line 202 and an additional source/drain line 204. The additional transmission gate line 202 and the additional source/drain line 204 extend along the second direction DR2, and are located between the second source/drain line 106 and the first gate line 108. In addition, the additional transmission gate line 202 is located between the second source/drain line 106 and the additional source/drain line 204. The additional transmission gate line 202, the second source/drain line 106 and the additional source/drain line 204 are functioned as terminals of the additional transmission gate ST1 as shown in FIG. 2B. The additional source/drain line 204 continuously extend to intersect with the first and second active structures F1 and F2 from above the first and second active structures F1 and F2. The additional transmission gate line 202 includes fifth and sixth gate line segments 202a and 202b, which extend along the second direction DR2, and are separated from each other. The fifth gate line segment 202a intersects with the first active structures F1 from above the first active structures F1, whereas the sixth gate line segment 202b intersects with the second active structures F2 from above the second active structures F2. The additional transmission gate 202, the second source/drain line 106 and the additional source/drain line 204 at opposite sides of the additional transmission gate line 102 and the underlying portions of the first and second active structures F1 and F2 define MOSFETs of complementary conductive types, of which source terminals and drain terminals are respectively connected together. As such, these MOSFETs of complementary conductive types constitute the additional transmission gate ST1 as shown in FIG. 2B. In some embodiments, the additional source/drain line 204 is functioned as an input of the additional transmission gate ST1, as well as the output of the first inverter IV1. In addition, the second source/drain line 106 is functioned as an output of the additional transmission gate ST1, as well as the output of the storage transmission gate ST. In some embodiment, the fifth gate line segment 202a may be out routed through a via V16 and a trace T11, and the sixth gate line segment 202b may be out routed through a via V17 and a trace T12.

FIG. 3A is a schematic layout diagram of two memory cells MC1 according to some embodiments of the present disclosure.

Referring to FIG. 3A, the two memory cells MC1 arranged along the second direction DR2 are each substantially identical to the memory cell MC1 shown in FIG. 2A, but are symmetrical with each other with respect to the common ground line GL shared by the two memory cells MC1. In addition, the second gate line segments 102b, the fourth gate line segments 122b, the sixth gate line segments 202b, the second dummy gate line segment 126b of the two memory cells MC1 are respectively and physically connected together. Similarly, the dummy gate line segments 138b and 140b may be respectively and physically connected together. In these embodiments, the second gate line segment 102b, the fourth gate line segment 122b, the sixth gate line segment 202b, the second dummy gate line segment 126b and the dummy gate line segments 138b and 140b may extend across the common ground line GL from below the common ground line GL. In addition, the second dummy gate line segment 126b and the dummy gate line segments 138b and 140b may be electrically connected with the common ground line GL through vias (not shown). In some embodiments, the second source/drain line segments 110b and the fourth source/drain line segments 118b of the two memory cells MC1 are respectively and physically connected together, and extend across the common ground line GL from below the common ground line GL. On the other hand, the first source/drain line segments 110a of the two memory cells MC1 are respectively and electrically connected to the two signal lines SL. Similarly, the third source/drain line segments 118a of the two memory cells MC1 are respectively and electrically connected to the two signal lines SL.

Therefore, the ground line GL, the gate line segments, the dummy gate line segments and the source/drain line segments may be shared by adjacent memory cells MC1. Accordingly, an area utilization efficiency of the semiconductor chip can be further improved.

FIG. 3B schematically illustrates symmetry of a plurality of memory cells MC1 according to some embodiments of the present disclosure.

Referring to FIG. 3A and FIG. 3B, each of the memory cells MC1 shown in FIG. 3B is substantially identical to the memory cell MC1 shown in FIG. 3A, except that the memory cell MC1 shown in FIG. 3B does not include the dummy gate lines 138 and 140. As such, the boundaries of the memory cell MC1 along the second direction DR2 as shown in FIG. 3B are defined by the first and seventh source/drain lines 104 and 124, whereas the boundaries of the memory cell MC1 along the first direction DR1 as shown in FIG. 3B are still defined by the signal line SL and the ground line GL. In addition, for conciseness, only elements at edges of each memory cell MC1 are schematically illustrated in FIG. 3B. Specifically, the first source/drain line 104 is schematically illustrated as a node N1, and the seventh source/drain line 124 is schematically illustrated as a node N2. In addition, the signal line SL is schematically illustrated as a node N3, and the ground line GL is schematically illustrated as a node N4. The label "F" illustrated as various orientations in FIG. 3A shows an orientation of each memory cell MC1. As shown in FIG. 3B, the adjacent memory cells MC1 arranged along the first direction DR1 is symmetrical with each other with respect to the node N1 or the node N2, and the node N1 or the node N2 is shared with the adjacent memory cells MC1 arranged along the first direction DR1. In addition, the adjacent memory cells MC1 arranged along the second direction DR2 is symmetrical with each other with respect to the node N3 or the node N4, and the node N3 or the node N4 is shared with the adjacent memory cells MC1 arranged along the second direction DR2.

Therefore, as a result of the symmetrical configuration of the memory cells MC1 described above, the edge elements (e.g., the source line SL, the ground line GL, the first source/drain line 104 and the seventh source/drain line 124) may be shared by adjacent memory cells MC1. Accordingly, an area utilization efficiency of the semiconductor chip can be further improved.

In the above-mentioned embodiments, the adjacent memory cell and logic cell of the semiconductor chip are located between the same pair of signal line and ground line, and both are penetrated by the same active structures. In other words, a cell height of the memory cell may be substantially equal to a cell height of the logic cell. As such, a layout topology of the memory cell is rather similar to a layout topology of the logic cell, except that a cell width of the memory cell may be greater than a cell width of the logic cell. Accordingly, the memory cell and the logic cell can be physically connected together, and an isolation structure (e.g., a STI structure) and/or a dummy memory cell are no longer required to be disposed between the memory cell and the logic cell. Therefore, an area utilization efficiency of the semiconductor chip is improved.

A semiconductor chip according to some embodiments of the present disclosure comprises a memory cell, a logic cell, a signal line and a ground line. The memory cell comprises first and second active structures, a storage transmission gate line, first through third gate lines and a read transmission gate line. The first and second active structures extend along a first direction and respectively have a first conductive type and a second conductive type complementary to the first conductive type. The storage transmission gate line extends along a second direction and comprises first and second gate line segments, which respectively intersects with the first and second active structures from above. The first through third gate lines extend along the second direction and intersects with the first and second active structures. The first through third gate lines are disposed aside the storage transmission gate line and sequentially arranged along the first direction away from the storage transmission gate line. The read transmission gate line extends along the second direction and comprises third and fourth gate line segments, which respectively intersects with the first and second active structures from above. The first through third gate lines are located between the storage transmission gate line and the read transmission gate line. The logic cell is disposed aside the memory cell. The signal line and the ground line extend along the first direction. The memory cell and the logic cell are located between the signal line and the ground line.

A semiconductor chip according to some other embodiments of the present disclosure comprises a SRAM cell, a logic cell, a signal line and a ground line. The logic cell is disposed aside the SRAM cell, and connected with the SRAM cell by first and second active structures. A conductive type of the first active structure is complementary to a conductive type of the second active structure. The SRAM cell and the logic cell are disposed and electrically connected between the signal line and the ground line, and the signal line and the ground line are substantially parallel with the first and second active structures.

A semiconductor chip according to yet another embodiment of the present disclosure comprises first and second memory cells, first and second signal lines and a common ground line. The first and second memory cells respectively comprises first and second active structures, a storage transmission gate line, first through third gate lines and a read transmission gate line. The first and second active structures extend along a first direction and respectively have a first conductive type and a second conductive type complementary to the first conductive type. The storage transmission gate line extends along a second direction and comprises first and second gate line segments, which respectively intersects with the first and second active structures. The first through third gate lines extend along the second direction and intersects with the first and second active structures. The first through third gate lines are disposed aside the storage transmission gate line and sequentially arranged along the first direction away from the storage transmission gate line.

The read transmission gate line extends along the second direction and comprises third and fourth gate line segments, which respectively intersects with the first and second active structures. The first through third gate lines are located between the storage transmission gate line and the read transmission gate line. The first and second signal lines extend along the first direction. The first and second memory cells are arranged along the second direction and located between the first and second signal lines. The common ground line extends along the first direction and located between the first memory cell and the second memory cell. The first and second memory cells are symmetrical with each other with respect to the common ground line. The second gate line segments of the first and second memory cells are connected together, and the fourth gate line segments of the first and second memory cells are connected together.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor chip, comprising:
    a memory cell, comprising:
        first and second active structures, extending along a first direction and respectively having a first conductive type and a second conductive type complementary to the first conductive type;
        a storage transmission gate line, extending along a second direction and comprising first and second gate line segments, which respectively intersects with the first and second active structures;
        first through third gate lines, extending along the second direction and intersecting the first and second active structures, wherein the first through third gate lines are disposed aside the storage transmission gate line and sequentially arranged along the first direction away from the storage transmission gate line; and
        a read transmission gate line, extending along the second direction and comprising third and fourth gate line segments, which separately and respectively intersects with the first and second active structures, wherein the first through third gate lines are located between the storage transmission gate line and the read transmission gate line; and
    a logic cell, disposed aside the memory cell; and
    a signal line and a ground line, extending along the first direction, wherein the memory cell and the logic cell are located between the signal line and the ground line.

2. The semiconductor chip of claim 1, further comprising:
    first through seventh source/drain lines, extending along the second direction and intersecting the first and second active structures, wherein
    the storage transmission gate line is located between the first and second source/drain line,
    the first gate line is located between the second and third source/drain line, and the third source/drain line comprises first and second source/drain line segments, which respectively intersects with the first and second active structures, the second gate line is located between the third and fourth source/drain lines, the third gate line is located between the fifth and sixth source/drain lines, and the fifth source/drain line comprises third and fourth source/drain line segments, which respectively intersects with the first and second active structures, and the read transmission gate line is disposed between the sixth and seventh source/drain lines.

3. The semiconductor chip of claim 2, wherein the second source/drain line is electrically connected with the second gate line, and the fourth source/drain line is located between the first and third gate lines.

4. The semiconductor chip of claim 2, wherein the first source/drain line segment and the third source/drain line segment are electrically connected with the signal line, and the second source/drain line segment and the fourth source/drain line segment are electrically connected with the ground line.

5. The semiconductor chip of claim 2, further comprising:

a dummy gate line, extending along the second direction and disposed between the second and third gate lines, wherein the dummy gate line comprises first and second dummy gate line segments, which respectively intersects with the first and second active structures, and the first and second dummy gate line segments are electrically connected to the signal line and the ground line respectively.

6. The semiconductor chip of claim 5, wherein the dummy gate line is disposed between the fourth and fifth source/drain lines.

7. The semiconductor chip of claim 1, wherein a cell height of the memory cell along the second direction is substantially equal to a cell height of the logic cell along the second direction.

8. A semiconductor chip, comprising:

a static random access memory (SRAM) cell;

a logic cell, disposed aside the SRAM cell, and connected with the SRAM cell by first and second active structures, wherein a conductive type of the first active structure is complementary to a conductive type of the second active structure; and a signal line and a ground line, wherein the SRAM cell and the logic cell are disposed and electrically connected between the signal line and the ground line, and the signal line and the ground line are substantially parallel with the first and second active structures.

9. The semiconductor chip of claim 8, wherein the SRAM cell comprises at least 10 metal-oxide-semiconductor field effect transistors formed on the first and second active structures.

10. The semiconductor chip of claim 9, wherein the SRAM cell comprises a storage transmission gate, a read transmission gate, a latch circuit and an inverter, wherein the latch circuit and the inverter are serially connected between the storage transmission gate and the read transmission gate, and the inverter is serially connected between the latch circuit and the read transmission gate.

11. The semiconductor of claim 10, wherein the latch circuit and the inverter are electrically connected to the signal line and the ground line.

12. The semiconductor of claim 8, wherein the first and second active structures extend along a first direction, and a cell height of the SRAM cell along a second direction is substantially equal to a cell height of the logic cell along the second direction, and the second direction is perpendicular to the first direction.

* * * * *